(12) United States Patent
Setlak et al.

(10) Patent No.: US 11,176,346 B2
(45) Date of Patent: Nov. 16, 2021

(54) ENHANCED UNDER-DISPLAY FINGERPRINT SENSING USING ANGLE-FOCUSED NARROW FIELD-OF-VIEW FILTERS

(71) Applicant: Apple inc., Cupertino, CA (US)

(72) Inventors: Dale Setlak, Merritt Island, FL (US); Mohammad Yeke Yazdandoost, San Jose, CA (US); Giovanni Gozzini, Berkeley, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 15/931,492

(22) Filed: May 13, 2020

(65) Prior Publication Data

US 2020/0387684 A1 Dec. 10, 2020

Related U.S. Application Data

(60) Provisional application No. 62/858,276, filed on Jun. 6, 2019.

(51) Int. Cl.
  *G06K 9/00* (2006.01)
  *G06F 3/042* (2006.01)

(52) U.S. Cl.
  CPC ......... *G06K 9/0004* (2013.01); *G06F 3/0421* (2013.01); *G06K 9/0008* (2013.01); *G06K 9/00899* (2013.01); *G06F 2203/04109* (2013.01)

(58) Field of Classification Search
  CPC ............... G06K 9/0004; G06K 9/0008; G06K 9/00899; G06F 3/0421; G06F 2203/04109
  See application file for complete search history.

(56) References Cited

U.S. PATENT DOCUMENTS

| | | | |
|---|---|---|---|
| 10,665,631 B1* | 5/2020 | Cai | H01L 51/42 |
| 2016/0132712 A1* | 5/2016 | Yang | G06K 9/0002 348/77 |
| 2016/0266695 A1* | 9/2016 | Bae | G06F 3/04166 |
| 2017/0286743 A1* | 10/2017 | Lee | G02B 5/201 |
| 2018/0129798 A1* | 5/2018 | He | G06F 3/042 |
| 2019/0012555 A1* | 1/2019 | Bae | G06K 9/2027 |
| 2019/0026523 A1* | 1/2019 | Shen | G02B 6/4203 |
| 2019/0286871 A1* | 9/2019 | Song | G06F 3/0346 |
| 2020/0293738 A1* | 9/2020 | Zhang | G02F 1/133606 |

* cited by examiner

Primary Examiner — Stephen G Sherman
(74) Attorney, Agent, or Firm — Morgan, Lewis & Bockius LLP

(57) ABSTRACT

An apparatus for fingerprint sensing includes a light-emitting layer, an optical layer, a filter layer and a pixelated image sensor. The light-emitting layer is covered by a transparent layer, and can illuminate a surface touching the transparent layer and allows transmission of reflected light from the surface to the optical layer. The optical layer includes a plurality of optical elements. The filter layer includes a number of apertures and spatially processes the reflected light. The pixelated image sensor can sense the spatially processed light. At least one of the optical layer or the filter layer enables an angle-focused FOV filtering of the reflected light.

25 Claims, 6 Drawing Sheets

|  | NORMAL | ANGLED | COMMENT |
|---|---|---|---|
| OLED EMISSIVITY | 1.0 | 0.6 | EST. 60% OF NORMAL |
| SPECULAR REFLECTION | 0.04 | 1.0 | FTIR |
| DISPLAY TRANSMISSION | 0.005 | 0.0025 | EST. 50% OF NORMAL |
| OPD COLLECTION | 1.0 | 0.7 | EST. 70% OF NORMAL |
| TOTAL | 0.0002 | 0.00105 |  |
| OVERALL GAIN FACTOR |  | 5.25 |  |
FIG. 3
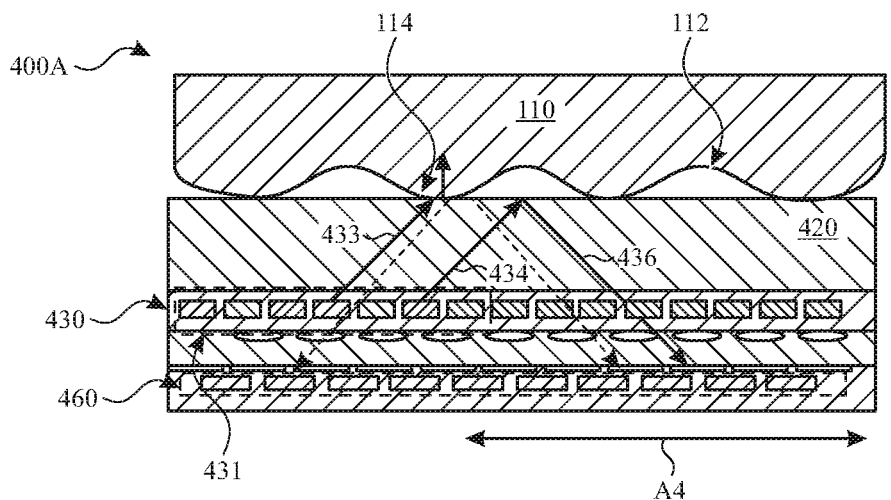
FIG. 4A
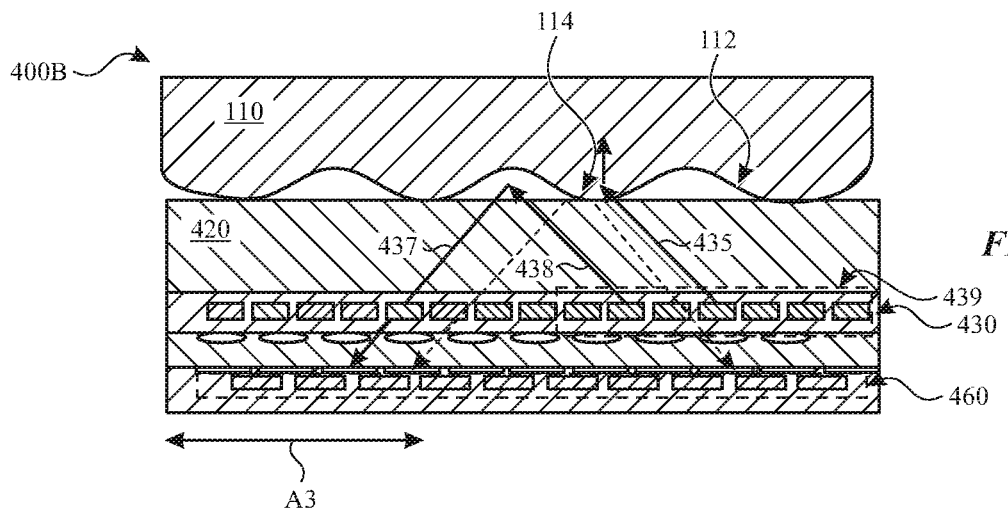
FIG. 4B

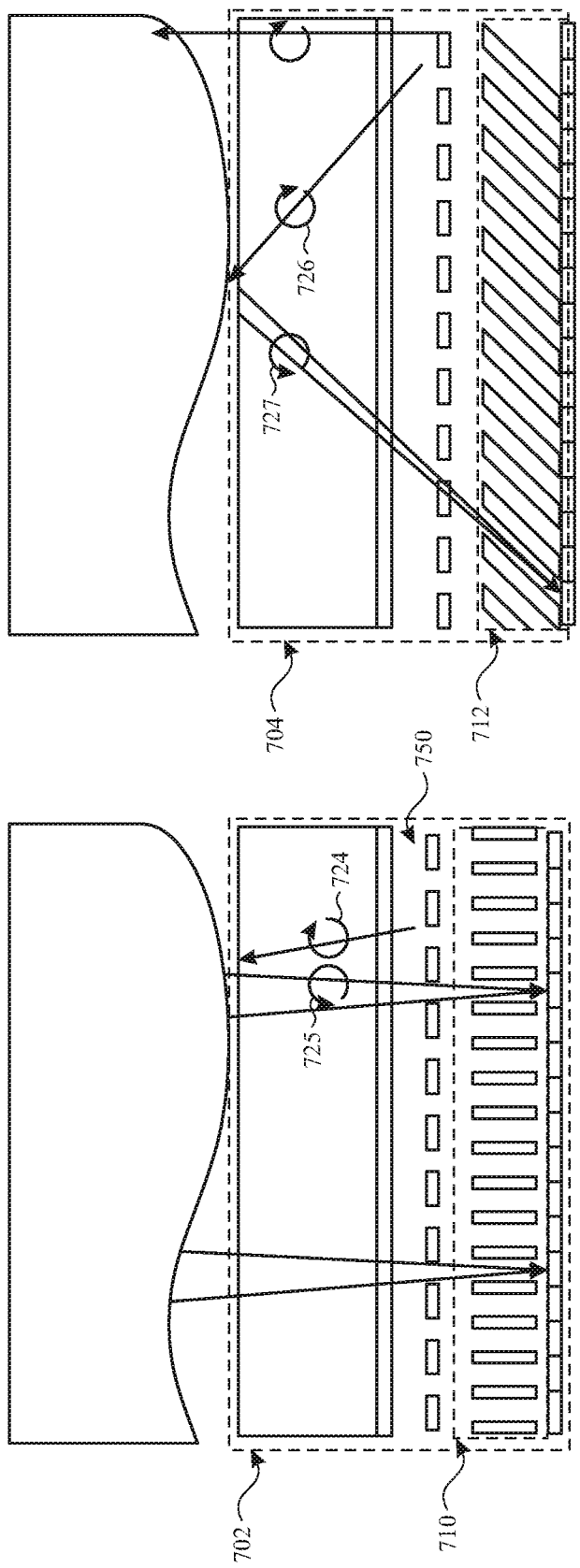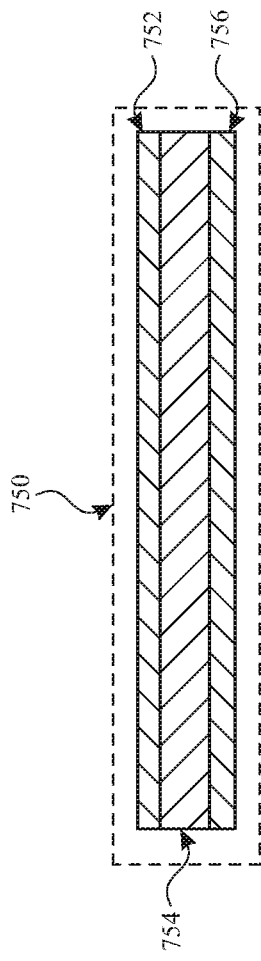

ENHANCED UNDER-DISPLAY FINGERPRINT SENSING USING ANGLE-FOCUSED NARROW FIELD-OF-VIEW FILTERS

CROSS-REFERENCE TO RELATED APPLICATIONS

This application claims the benefit of priority under 35 U.S.C. § 119 from U.S. Provisional Patent Application 62/858,276 filed Jun. 6, 2019, which is incorporated herein by reference in its entirety.

TECHNICAL FIELD

The present description relates generally to sensor technology and, more particularly, to an enhanced under-display fingerprint sensing using angle-focused narrow field-of-view filters.

BACKGROUND

Fingerprint sensing and matching is widely used as a reliable technique for personal identification or verification. In particular, a common approach to fingerprint identification involves scanning a sample fingerprint of a person to form an image and storing the image as a unique characteristic of the person. The characteristics of the sample fingerprint may be compared to information associated with reference fingerprints already stored in a database to determine proper identification of the person, such as for verification purposes.

An optical fingerprint sensor may be particularly advantageous for verification and/or authentication in an electronic device and, more particularly, a portable device, for example, a portable communication device. The optical fingerprint sensor may be carried by the housing of a portable communication device, for example, and may be sized to sense a fingerprint from a single finger. Where an optical fingerprint sensor is integrated into an electronic device or host device, as noted above, the authentication can be performed quickly, for example, by a processor of the host device. The challenges facing the optical fingerprint sensor include consistency in performance over time, as the glass-air interfaces are not stable enough for small area matching. On the other hand, the large-area sensors using complementary metal-oxide-semiconductors (CMOSs) are not cost-effective. Separation of different reflection rays at various angles is another challenge, as many illumination patterns have to be used to separate the reflection rays, which leads to a long (e.g., a few seconds) image capture time.

BRIEF DESCRIPTION OF THE DRAWINGS

Certain features of the subject technology are set forth in the appended claims. However, for purposes of explanation, several embodiments of the subject technology are set forth in the following figures.

FIG. 3 is a table comparing various parameters of an under-display optical fingerprint sensor of the subject technology with an existing under-display optical fingerprint sensor.

FIGS. 4A and 4B are diagrams illustrating example setups of an under-display optical fingerprint sensor of the subject technology to reduce the effects of occlusion by a touch-display layer.

FIGS. 7A, 7B and 7C are diagrams illustrating examples of under-display optical fingerprint sensors and an example structure of a polarizer.

DETAILED DESCRIPTION

Figure 1A:
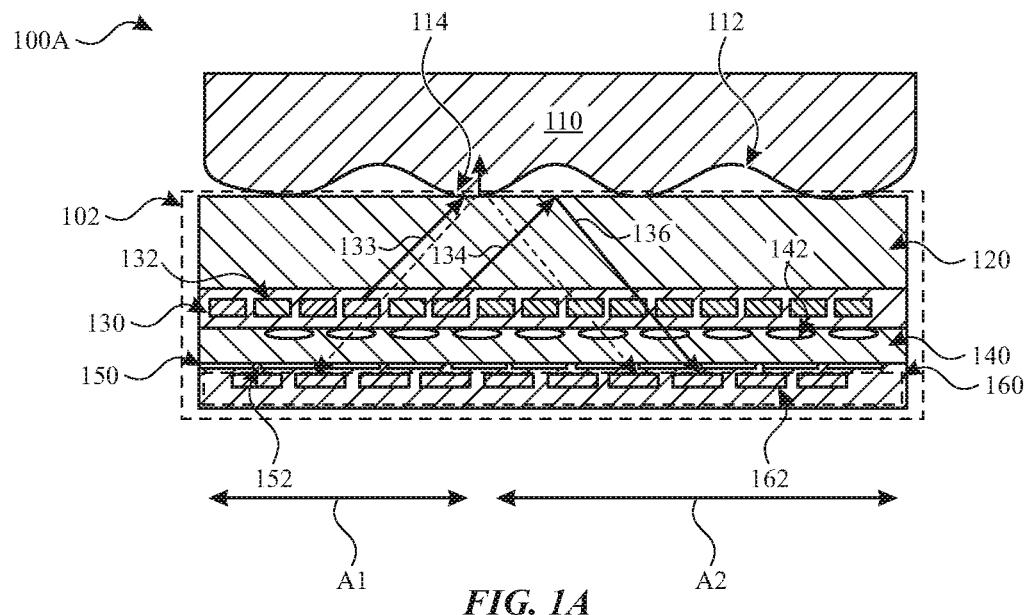
FIG. 1A is a diagram illustrating an example of an under-display optical fingerprint sensor with angle-focused narrow field-of-view (FOV) filters, in accordance with one or more aspects of the subject technology.

The detailed description set forth below is intended as a description of various configurations of the subject technology and is not intended to represent the only configurations in which the subject technology may be practiced. The appended drawings are incorporated herein and constitute part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in a block diagram form in order to avoid obscuring the concepts of the subject technology.

The subject technology is directed to an under-display fingerprint sensing apparatus with angle-focused narrow field-of view (FOV) filtering. The apparatus includes a light-emitting layer, an optical layer, a filter layer and a pixelated image sensor. The light-emitting layer is covered by a transparent layer and can emit light to illuminate a surface touching the transparent layer, and allows transmission of reflected light from the surface to the optical layer. The optical layer includes a plurality of optical elements. The filter layer includes a number of apertures and spatially processes the reflected light. The pixelated image sensor can sense the spatially processed light. One of the optical layer or the filter layer enables an angle-focused FOV filtering of the reflected light.

In some implementations, the optical layer includes a microlens layer consisting of a number of microlenses. When the filter layer is used to enable the angle-focused FOV filtering of the reflected light, the apertures of the plurality of apertures are misaligned with respect to centers of respective microlenses of the plurality of microlenses, as described in more detail herein.

In one or more implementations, the optical layer is used to enable the angle-focused FOV filtering of the reflected light, and in this case the optical elements are designed to bend incident rays, as explained in more detail herein. The optical layer may be a multilayer optical structure including multiple microlens layers. The light-emitting layer can be an organic light emitting diode (OLED) display. The pixelated image sensor can be a thin-film transistor (TFT)-based organic imager.

In one or more implementations, the subject technology can reduce OLED display occlusion effects. For example, OLEDs of a portion of the OLED display can be turned off to enable imaging of a region of a finger with different occlusion patterns to reduce OLED display occlusion effects, as described in more detail herein. The under-display fingerprint sensing apparatus can also be employed to detect fingerprint spoof. For instance, one of the optical layer or the filter layer can be arranged to enable enhanced fingerprint spoof detection by using the angle-focused FOV filtering of the reflected light, as explained in more detail herein.

In some implementations, the filter layer is a fiber optics plate including a collection of optical fiber films bundled with an opaque separator material and is configured to achieve a narrow FOV of approximately +/−3 degrees. The surface touching the transparent layer can be a surface of a human finger including ridges and valleys. The filter layer can eliminate reflections resulting from angled illumination of walls of valleys, as explained in more detail herein.

In some implementations, the apparatus of the subject technology includes a transparent layer, a touch-display layer, an optical-processing layer, a collimation layer and an image sensor. The touch-display layer is coupled to the transparent layer and can emit light to illuminate a surface touching the transparent layer and allows transmission of a reflected light from the surface. The collimation layer includes a number of apertures and can spatially process the reflected light. The image sensor senses the spatially processed reflected light. The touch-display layer allows transmission of reflected light from the surface to the optical-processing layer, and the optical-processing layer enables an angle-focused FOV filtering of the reflected light, as described in more detail herein.

In some implementations, the optical-processing layer includes a diffractive layer consisting of diffractive elements that can diffract the reflected light to enable the angle-focused FOV filtering of the reflected light. The optical-processing layer includes a microlens layer that has multiple microlenses. The apparatus may further include a holographic layer disposed between the touch-display layer and the optical-processing layer.

In one or more implementations, the optical-processing layer is a multilayer structure including multiple layers of optical elements, such as microlenses. The touch-display layer may be an organic light-emitting diode (OLED) display. The image sensor can be a pixelated image sensor including a thin-film transistor (TFT)-based organic imager. The collimation layer may be a microaperture plate including transparent glass or resin embedded in an opaque glass or resin material and can provide a narrow FOV of approximately +/−3 degrees. The surface touching the transparent layer may be a surface of a human finger including ridges and valleys. The collimation layer can eliminate reflections resulting from angled illumination of walls of valleys, as described in more detail herein.

In some implementations, one of the optical-processing layer or the collimation layer can enable an enhanced fingerprint spoof detection by using the angle-focused FOV filtering of the reflected light, as described in more detail herein.

FIG. 1A is a diagram illustrating an example of an under-display optical fingerprint sensor 102 with angle-focused narrow FOV filters, in accordance with one or more aspects of the subject technology. The cross-sectional view of the under-display optical fingerprint sensor 102 with angle-focused narrow FOV (hereinafter "fingerprint sensor 102") is shown in diagram 100A, which also shows a human finger 110 (hereinafter "finger 110"). The touch surface of the finger 110 is referred to as a "touching surface" or just a "surface" touching the fingerprint sensor 102.

The fingerprint sensor 102 includes a transparent layer 120, a touch-display layer 130, an optical layer 140, a filter layer 150 and an image sensor 160. The transparent layer 120 can be a glass cover or any other transparent layer that is used to protect the touch-display layer 130. The transparent layer 120 can be transparent to lights within the visible spectrum. In some implementations, the transparent layer 120 can be further transparent to ultraviolet (UV) and/or infrared (IR) light as well. The transparent layer 120 can be attached to the touch-display layer 130 via an optical adhesive layer, not shown for simplicity.

The touch-display layer 130, also referred to as a light-emitting layer, is transparent to reflected light from the touching surface to underlying layers and includes multiple OLEDs 132. The OLED includes an emissive electroluminescent layer, which is a film of an organic compound that emits light in response to an electric current. This layer of organic compound is situated between two electrodes, of which at least one is a transparent electrode, for example, made of indium-tin oxide (ITO). OLEDs 132 are employed to create digital displays in a variety of devices and/or systems such as television screens, computer monitors, portable communication devices such as mobile phones, handheld game consoles and other electronic displays. The touch-display layer 130 can emit light (e.g., visible light) to illuminate the touching surface. The optical layer 140, also referred to as an optical-processing layer, can be made of an array of optical elements. In some implementations, the optical layer 140 is a multilayer optical structure including one or more microlens layers containing a number of microlenses 142.

The filter layer 150, also referred to as a collimation layer, is an important component of the fingerprint sensor 102, which is of particular interest in the subject technology and will be discussed in more detail herein. The filter layer 150 includes a number of apertures (holes) 152, for example, a regular array of apertures 152 that are matched in number with the microlenses 142 of the optical layer 140. In one or more implementations, as a core feature of the subject technology, the apertures 152 of the filter layer 150 are not aligned with the center points of the optical elements such as microlenses 142. Such an intentional misalignment is one way of enabling the angle-focused narrow FOV filtering of the subject technology.

The image sensor 160 is a TFT-based organic imager. A TFT-based organic imager is an organic imager that is fabricated on a TFT-based electronic readout backplane. The organic imager can be an array of organic semiconductor photodiodes 162. The organic semiconductor photodiodes 162 can be made of, for example, a stack of evaporated ultrathin (e.g., <100 nm) films of an organic substance such as choloro-boron (e.g., SubPc/C-60), which is sensitive in a wavelength range of about 300 nm to 650 nm.

The finger 110 is considered to be a normal (e.g., not wet or dry) finger and when touching the fingerprint sensor 102 presents a valley region 112 and a ridge region 114 to the transparent layer 120. In the valley region 112, the light 134 emitted at an angle by region A1 of touch-display layer 130 can be reflected from a glass-air interface at a top surface of the transparent layer 120 as a strong specular reflection component 136 and reach a region A2 of the image sensor 160. Alternatively, the light 134 enters the finger and is reflected back at some point within the finger tissue as a remission reflection component (not shown for simplicity). In the valley region 112, there may also be wall reflections from the skin of the finger 110 from angle-illumination rays; this component is typically weak compared to the other components. In the ridge region 114, the light 133 emitted by touch-display layer 130 can be reflected from the touching surface of the finger 110 as remission reflection components that are weak components. When the finger 110 is wet, the space between the top surface of the transparent layer 120 and the valley region 112 of the finger 110 may be filled with sweat resulting in an additional specular reflection component (not shown for simplicity). When the finger is dry, on the other hand, additional specular reflection can be produced in the ridge region 114.

As another important feature of the subject technology, when the OLEDs 132 located in the region A1 of the touch-display layer 130 are active, the OLEDs 132 located in the region A2 of the touch-display layer 130 are turned off. This feature allows reducing the effects of occlusion by the touch-display layer 130, as the OLEDs 132 of the region (A2) where the specular reflection 136 is detected are tuned off and do not emit any light to be received by the sensors of that region (A2).

Figure 1B:
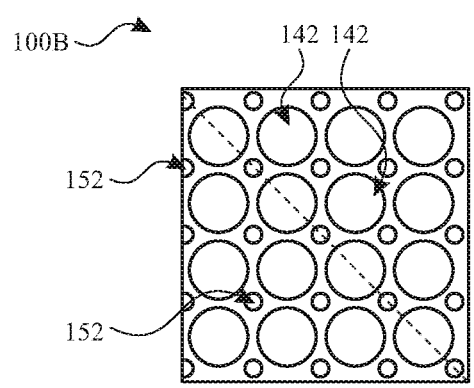
FIG. 1B is a diagram illustrating respective positions of collimation apertures and microlenses of the under-display optical fingerprint sensor of FIG. 1A, in accordance with one or more aspects of the subject technology.

FIG. 1B is a diagram illustrating respective positions of collimation apertures and microlenses of the under-display optical fingerprint sensor of FIG. 1A, in accordance with one or more aspects of the subject technology. A top view 100B shown in FIG. 1B depicts microlenses 142 of the optical layer 140 of FIG. 1A and apertures 152 of the filter layer 150 of FIG. 1A. The top view 100B clearly shows the displacement of the apertures 152 with respect to the center points of the microlenses 142. The displacement allows for implementing the angle-focus filtering feature of the subject disclosure, as described above.

Figure 2A:
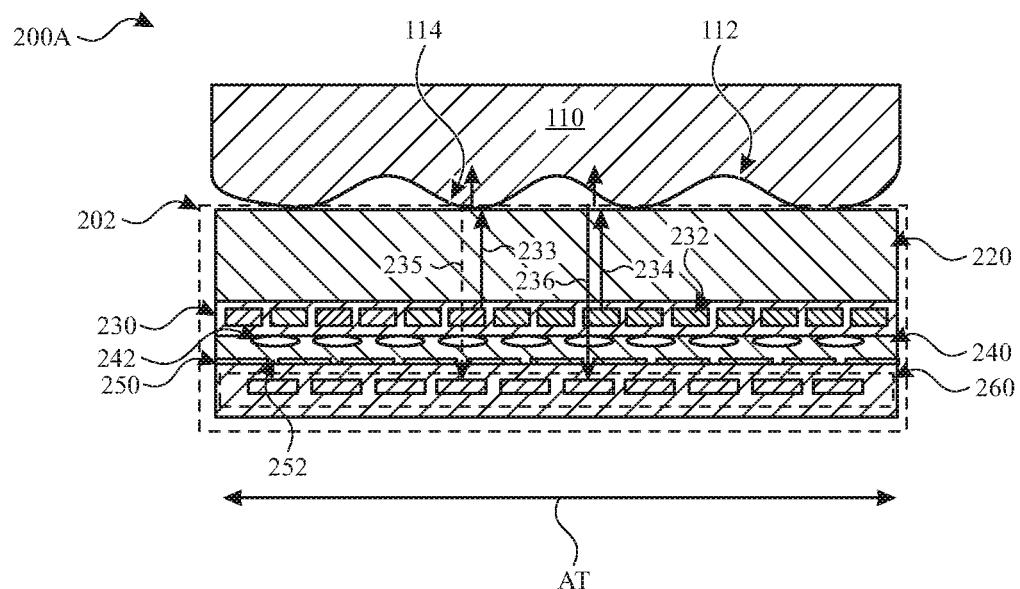
FIG. 2A is a diagram illustrating an example of an existing under-display optical fingerprint sensor.

FIG. 2A is a diagram illustrating an example of an existing under-display optical fingerprint sensor 202. The cross-sectional view of the existing under-display optical fingerprint sensor 202 (hereinafter "fingerprint sensor 202") is shown in diagram 200A, which also shows a human finger 110. The fingerprint sensor 202 includes a transparent layer 220, a touch-display layer 230, an optical layer 240, a collimator layer 250 and an image sensor 260. The structures of the transparent layer 220, the touch-display layer 230 including OLEDs 232, the optical layer 240, the collimator layer 250 and the image sensor 260 are similar to the structures of the transparent layer 120, the touch-display layer 230, the optical layer 140, the filter layer 150 and the image sensor 160 of the fingerprint sensor 102 of FIG. 1A, respectively. The distinction between the fingerprint sensor 102 of the subject technology and the fingerprint sensor 202 is the displacement of the apertures 152 with respect to the center points of the microlenses 142 of FIG. 1A, which does not exist in the fingerprint sensor 202. In the case of the fingerprint sensor 202, in the valley region 112, the light 234 emitted normal to the touch-display layer 230 can be reflected from a glass-air interface at a top surface of the transparent layer 220 as a weak specular reflection component 236. Alternatively, the light 234 enters the finger 110 and is reflected back at some point within the finger tissue as a remission reflection component (not shown for simplicity). In the ridge region 114, the light 233 emitted by touch-display layer 230 can be reflected from the touching surface of the finger 110 as a remission reflection component 235 that is a weak component. The weak specular reflection component 236 may have similar intensity as the remission reflection component 235. Further, OLEDs 232 of the entire area of the touch-display layer 230 are active and their backward emissions can contribute as noise and inhibit a clear detection of the reflections from the touch. Also, some of the reflections from the touch are blocked by the OLEDs 232, which results in impressing an occlusion pattern on the image of the touch. For these reasons, the existing under-display optical fingerprint sensors suffer from weak and unstable reflections of the fingerprint pattern. Different reflections from the various regions of the surface of the transparent layer 220 and the finger skin can be mixed together at the image sensor 260 and the patterns they carry tend to cancel each other out. Furthermore, as explained above, the specular reflection 236 from the transparent layer 220 to air interface can be similar in intensity to the diffuse remission reflection component 235 from the skin. This aggravates the image pattern cancellation effect noted above. Current under-display fingerprint sensing systems also may use a uniform flood illumination approach that prevents separation of the conflicting reflection types that could mitigate the cancellation effects.

Figure 2B:
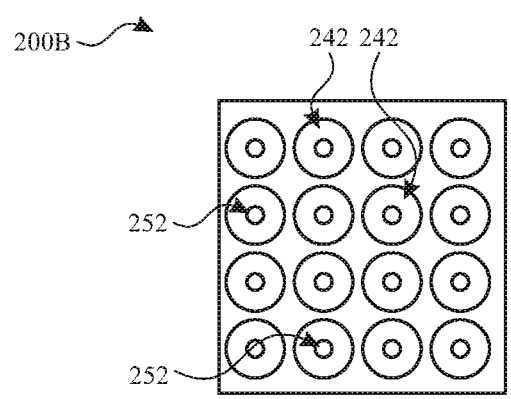
FIG. 2B is a diagram illustrating respective positions of collimation apertures and microlenses of the under-display optical fingerprint sensor of FIG. 2A.

FIG. 2B is a diagram illustrating respective positions of collimation apertures and microlenses of the under-display optical fingerprint sensor of FIG. 2A. A top view 200B shown in FIG. 2B depicts microlenses 242 of the optical layer 240 of FIG. 2A and apertures 252 of the filter layer (also referred to as collimator layer) 250 of FIG. 2A. The top view 200B clearly shows that the apertures 252 are positioned aligned with the center points of the microlenses 242.

The subject technology reconfigures the narrow field of view (NFV) filters to focus at an angle to the cover glass surface, as shown in FIG. 1B. At steeper angles, the specular reflection (136 of FIG. 1A) from the glass to air interface becomes much stronger than the specular reflection (236 of FIG. 2A) at the normal angle. The subject technology can separate, by restricting the illumination region A1 (and hence the illumination incidence angle), the conflicting remission reflections from each other and allow them to be captured and analyzed separately. This minimizes the pattern cancelling effect between the transparent layer to air specular reflections and the diffuse skin remission reflections. Further, the image formed by the image sensor 160 in the imaging region A2 is immune from backward OLED emission, as the OLEDs 232 on the top of the imaging region A2 are off. The disclosed angled illumination and angled NFV focus of the subject technology can generate a stronger, more stable image pattern than the existing systems that are designed for normal illumination and capture.

FIG. 3 is a table 300 comparing various parameters of an under-display optical fingerprint sensor of the subject technology with an existing under-display optical fingerprint sensor. In the table 300, a number of parameter values of the existing fingerprint sensor 202 are compared with corresponding parameter values of the fingerprint sensor 102 of the subject technology. The list of parameters, as shown in the first column of table 300, includes OLED emissivity, specular reflection, display transmission, organic photodetector (OPD) collection, and an overall gain factor. The numbers in the column labeled "normal" correspond to the fingerprint sensor 202 of FIG. 2A and the numbers in the column labeled "angled" are estimated values and correspond to the fingerprint sensor 102 of FIG. 1A. The specular reflection (e.g., 136 of FIG. 1A) corresponds to frustrated total internal reflection (FTIR), which at the glass-air-interface occurs at an incidence angle of about 42 degrees. The overall gain factor is 5.25 that shows an improvement of more than five times in gain for the fingerprint sensor 102 as compared to the fingerprint sensor 202.

FIGS. 4A and 4B are diagrams illustrating example setups 400A and 400B of the under-display optical fingerprint sensor of the subject technology to reduce effects of occlusion by a touch-display layer. FIG. 4A depicts a setup 400A of the under-display optical fingerprint sensor of the subject technology discussed above. In the setup 400A, the finger 110 is illuminated from the left-hand side by active OLEDs 431 of the touch-display layer 430, and the reflections are sensed by an imaging area A4 of the image sensor 460. The light 434 emitted at an angle (e.g., 42 degrees) by the active OLEDs 431 can be reflected from a glass-air interface at a top surface of the transparent layer 420 as a strong specular reflection component 436 and reach an imaging area A4 of the image sensor 460. The light 433 emitted at an angle by the active OLEDs 431 can be reflected from the touching surface of the finger 110 as remission reflection components that are weak components. The image formed by the imaging area A4 provides a first occlusion pattern due to occlusion of the reflected light (e.g., 436) by the OLEDs of the touch-display layer 430.

FIG. 4B depicts a setup 400B of the under-display optical fingerprint sensor of the subject technology discussed above. In the setup 400B, the finger 110 is illuminated, from the right-hand side, by active OLEDs 439 of the touch-display layer 430. The reflections are sensed by an imaging area A3 of the image sensor 460. The light 438 emitted at an angle (e.g., 42 degrees) by the active OLEDs 439 can be reflected from a glass-air interface at a top surface of the transparent layer 420 as a strong specular reflection component 437 and reach an imaging area A3 of the image sensor 460. The light 435 emitted at an angle by active OLEDs 439 can be reflected from the touching surface of the finger 110 as remission reflection components that are weak components.

The image formed by the imaging area A3 provides a second occlusion pattern that along with the first occlusion pattern formed by the setup 400A of FIG. 4A can be employed to reduce the effects of occlusion by the touch-display layer 430. This is because the additional occlusion pattern (second occlusion pattern), although related to the same area of the touch, is different from the first occlusion pattern. Further, illumination at different directions can result in more occlusion patterns that can be used to average out and reduce the occlusion effect of the OLEDs of the touch-display layer 430.

Figure 5:
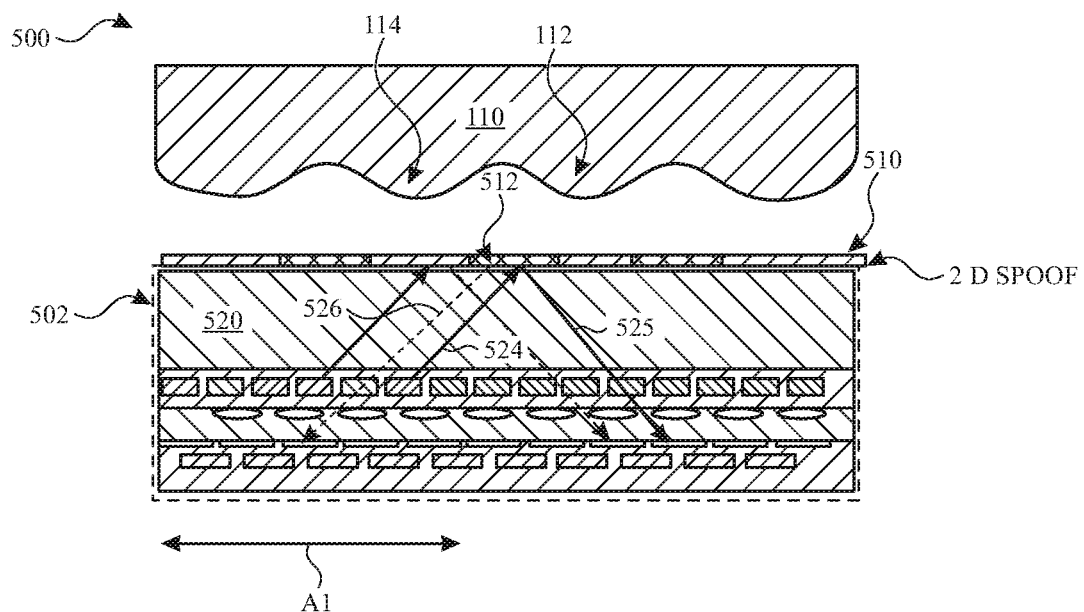
FIG. 5 is a diagram illustrating a spoof detection scheme of an example under-display optical fingerprint sensor with angle-focused FOV filters, in accordance with one or more aspects of the subject technology.

FIG. 5 is a diagram illustrating a spoof detection scheme 500 of an example under-display optical fingerprint sensor 502 with angle-focused FOV filters, in accordance with one or more aspects of the subject technology. In the spoof detection scheme 500 shown in FIG. 5, a two-dimensional (2D) spoof is used to fool the under-display optical fingerprint sensor 502 (hereinafter, fingerprint sensor 502). The 2D spoof can, for example, be a printed image of a finger, and may readily be recognized by the existing fingerprint sensors used in many devices such as cell phones as a real finger 110. The fingerprint sensor 502 of the subject technology can easily detect the 2D spoof and distinguish it from an actual three-dimensional (3D) finger 110 with a ridge region 114 and a valley region 112. When the 2D spoof 510 is placed on the top of the transparent layer 520 of the fingerprint sensor 502, a diffused reflection 526 of a light 524 incident on a region 512 (corresponding to valley region 112) is almost as strong as a specular reflection 525 of the light 524. This is very different from the case of a real finger 110, where the specular reflection is much stronger than the diffused reflected light. This distinction can be readily leveraged by the fingerprint sensor 502 of the subject technology to detect fingerprint spoof.

Figure 6:
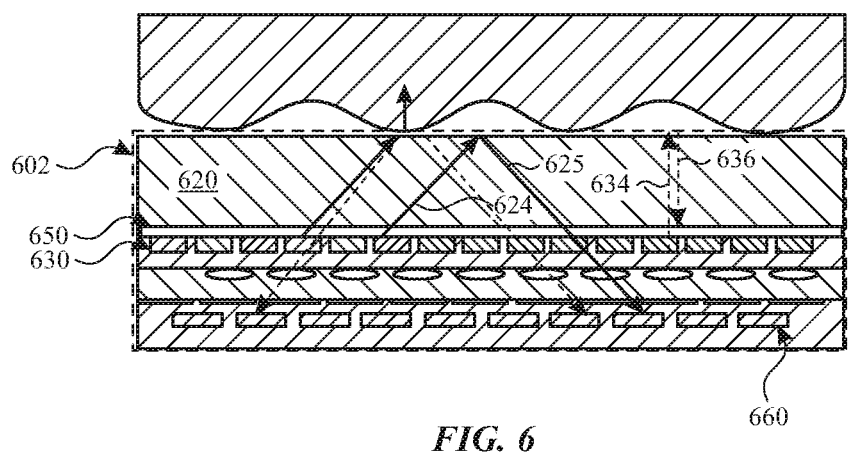
FIG. 6 is a diagram illustrating an example of an under-display optical fingerprint sensor with angle-focused narrow FOV filters including a polarizer, in accordance with one or more aspects of the subject technology.

FIG. 6 is a diagram illustrating an example of an under-display optical fingerprint sensor 602 with angle-focused narrow FOV filters including a polarizer 650, in accordance with one or more aspects of the subject technology. The under-display optical fingerprint sensor 602 (hereinafter, fingerprint sensor 602) is similar in structure and functionalities to the fingerprint sensor 502 of FIG. 5, except that a polarizer 650, which was not shown in FIG. 5, is revealed here. The polarizer 650 may include a number of layers, for example, two quarter-wave plates and a linear polarizer layer. A polarizer (e.g., 650) may be present in many displays, particularly in handheld communication devices, such as smartphones, to prevent the display from reflecting back to a user an image of the user's face or other objects in front of the display. It is understood, however, that for existing under-display fingerprint sensors (e.g., 202 of FIG. 2A) which do not include the angle-focused feature of the fingerprint sensor 602, the polarizer 650 can interfere with the performance of the vertical fingerprinting. For instance, for the case of pretend light rays 634 (similar to 234 of FIG. 2A) emitted vertical to the transparent layer 620 by the OLED 630, the reflected-back rays 636 from glass at the valley region of the finger can be prevented by the polarizer from reaching the image sensor 660.

For the fingerprint sensor 602 of the subject technology that is angle focused, advantageously, the polarizer has little or no adverse effect. For example, a spherically polarized light 624 from the OLED 630 when passing through the polarizer 650 can become elliptically polarized (e.g., right-handed), which when reflected back (625) can be left-handed elliptical that can pass through the polarizer 650 with no significant blocking.

FIGS. 7A, 7B and 7C are diagrams illustrating examples of under-display optical fingerprint sensors 702 and 704 and an example structure of a polarizer 750. The under-display optical fingerprint sensor 702 (hereinafter, fingerprint sensor 702) shown in FIG. 7A is similar in structure and functionalities to the fingerprint sensor 602 of FIG. 6, except that a collimator 710 of the fingerprint sensor 702 is a normal collimator and not an angle-focused collimator. A polarizer 750 of the fingerprint sensor 702 is similar to the polarizer 650 of FIG. 6 and includes a first layer 752, a second layer 754 and a third layer 756, as shown in FIG. 7C. In one or more implementations, the first layer 752 is a quarter-wave plate that can acts as a retarder, the second layer 754 is a linear polarizer and the third layer 756 is another quarter-wave plate (retarder). The combination of the first and second layers 752 and 754 can circularize the polarization of the light 724 emitted by the touch-display layer, and can block the reflected specular reflected light 725 from reaching the image sensors.

The under-display optical fingerprint sensor 704 (hereinafter, fingerprint sensor 704) shown in FIG. 7B is similar in structure and functionalities to the fingerprint sensor 602 of FIG. 6, except that the angle-focused feature of a collimator 712 of the fingerprint sensor 704 is clearly shown. In the case of the fingerprint sensor 704, the fingerprint is captured at large-angle reflection, and it is known that the circular polarization of the light 726 emitted by the touch-display layer at a large angle is converted by the polarizer 750 to elliptical polarization. Therefore, the reflected light 727 is also elliptically polarized, and would not be fully blocked by the combination of the first layer 752 and the second layer 754 of the polarizer 750.

Figure 8:
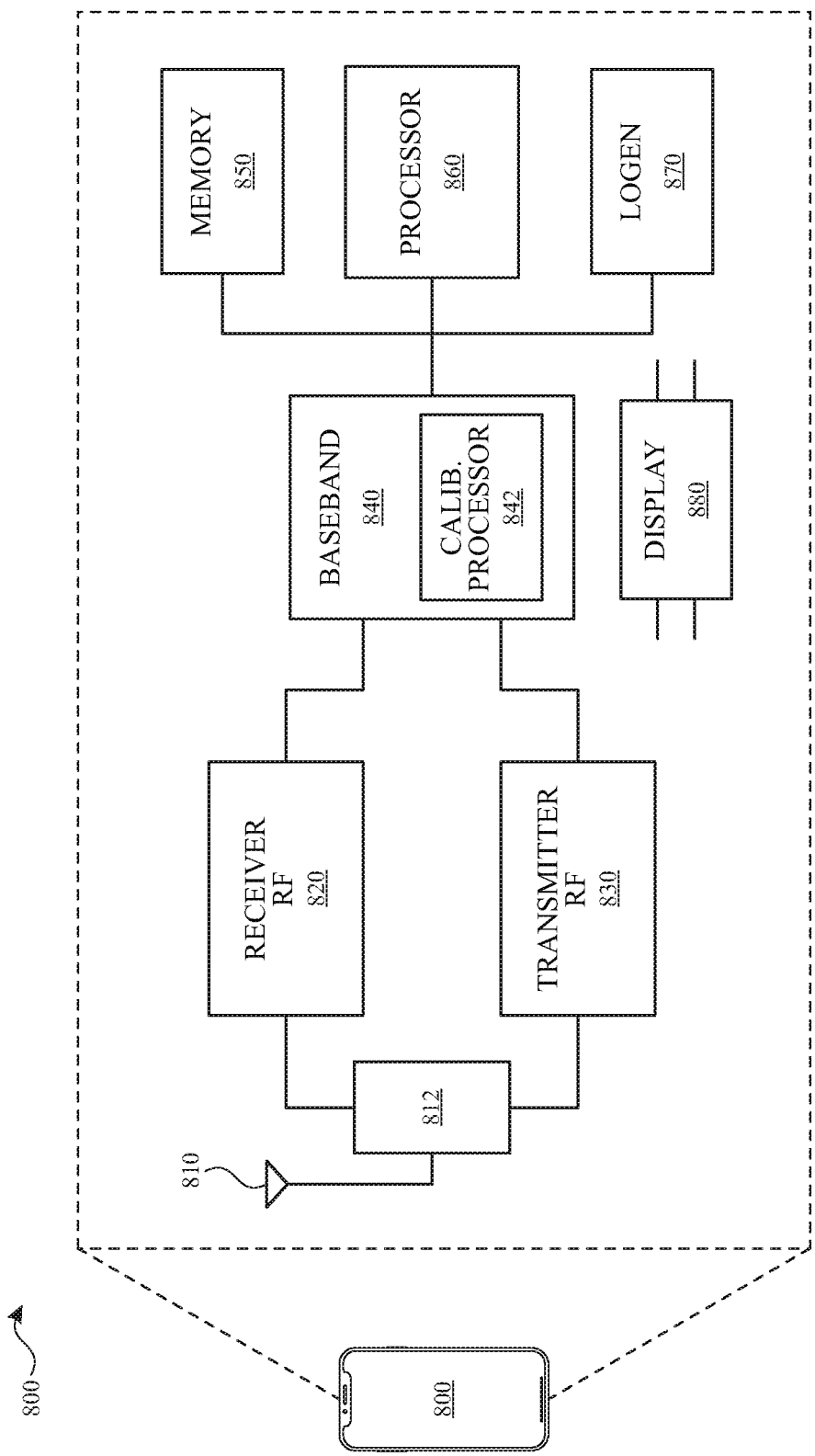
FIG. 8 is a block diagram illustrating a wireless communication device, within which one or more aspects of the subject technology can be implemented.

FIG. 8 is a block diagram illustrating a wireless communication device, within which one or more aspects of the subject technology can be implemented. In one or more implementations, the wireless communication device 800 can be a smartphone or a smartwatch that hosts an apparatus of the subject technology including an under-display optical fingerprint sensor with angle-focused filters. The wireless communication device 800 may comprise a radio-frequency (RF) antenna 810, duplexer 812, a receiver 820, a transmitter 830, a baseband processing module 840, a memory 850, a processor 860, a local oscillator generator (LOGEN) 870, and a display 880. In various embodiments of the subject technology, one or more of the blocks represented in FIG. 8 may be integrated on one or more semiconductor substrates. For example, the blocks 820-870 may be realized in a single chip or a single system on a chip, or may be realized in a multichip chipset.

The receiver 820 may comprise suitable logic circuitry and/or code that may be operable to receive and process signals from the RF antenna 810. The receiver 820 may, for example, be operable to amplify and/or down-convert received wireless signals. In various embodiments of the subject technology, the receiver 820 may be operable to cancel noise in received signals and may be linear over a wide range of frequencies. In this manner, the receiver 820 may be suitable for receiving signals in accordance with a variety of wireless standards, Wi-Fi, WiMAX, Bluetooth, and various cellular standards. In various embodiments of the subject technology, the receiver 820 may not use any saw-tooth acoustic wave (SAW) filters and few or no off-chip discrete components such as large capacitors and inductors.

The transmitter 830 may comprise suitable logic circuitry and/or code that may be operable to process and transmit signals from the RF antenna 810. The transmitter 830 may, for example, be operable to up-convert baseband signals to RF signals and amplify RF signals. In various embodiments of the subject technology, the transmitter 830 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 830 may be operable to provide signals for further amplification by one or more power amplifiers.

The duplexer 812 may provide isolation in the transmit band to avoid saturation of the receiver 820 or damaging parts of the receiver 820, and to relax one or more design requirements of the receiver 820. Furthermore, the duplexer 812 may attenuate the noise in the receive band. The duplexer may be operable in multiple frequency bands of various wireless standards.

The baseband processing module 840 may comprise suitable logic, circuitry, interfaces, and/or code that may be operable to perform processing of baseband signals. The baseband processing module 840 may, for example, analyze received signals and generate control and/or feedback signals for configuring various components of the wireless communication device 800, such as the receiver 820. The baseband processing module 840 may be operable to encode, decode, transcode, modulate, demodulate, encrypt, decrypt, scramble, descramble, and/or otherwise process data in accordance with one or more wireless standards.

The processor 860 may comprise suitable logic, circuitry, and/or code that may enable processing data and/or controlling operations of the wireless communication device 800. In this regard, the processor 860 may be enabled to provide control signals to various other portions of the wireless communication device 800. The processor 860 may also control transfer of data between various portions of the wireless communication device 800. Additionally, the processor 860 may enable implementation of an operating system or otherwise execute code to manage operations of the wireless communication device 800. In one or more implementations, the processor 860 can be used to process signals of the under-display fingerprint sensor of the subject technology (e.g., signals from the image sensor 160 of FIG. 1A) to generate a fingerprint image and compare the fingerprint image with a number of reference finger prints stored in a database to identify and/or authenticate a person associated with the finger print or to detect a 2D spoof.

The memory 850 may comprise suitable logic, circuitry, and/or code that may enable storage of various types of information such as received data, generated data, code, and/or configuration information. The memory 850 may comprise, for example, RAM, ROM, flash, and/or magnetic storage. In various embodiments of the subject technology, information stored in the memory 850 may be utilized for configuring the receiver 820 and/or the baseband processing module 840. In some implementations, the memory 850 may store image information from processed and/or unprocessed fingerprint images of the under-display fingerprint sensor of the subject technology. The memory 850 may also include one or more databases of reference finger prints that can be used to identify and/or authenticate a person associated with the finger print.

The LOGEN 870 may comprise suitable logic, circuitry, interfaces, and/or code that may be operable to generate one or more oscillating signals of one or more frequencies. The LOGEN 870 may be operable to generate digital and/or analog signals. In this manner, the LOGEN 870 may be operable to generate one or more clock signals and/or sinusoidal signals. Characteristics of the oscillating signals such as the frequency and duty cycle may be determined based on one or more control signals from, for example, the processor 860 and/or the baseband processing module 840.

In operation, the processor 860 may configure the various components of the wireless communication device 800 based on a wireless standard according to which it is desired to receive signals. Wireless signals may be received via the RF antenna 810, amplified, and down-converted by the receiver 820. The baseband processing module 840 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 850, and/or information affecting and/or enabling operation of the wireless communication device 800. The baseband processing module 840 may modulate, encode, and perform other processing on audio, video, and/or control signals to be transmitted by the transmitter 830 in accordance with various wireless standards.

In one or more implementations, the display 880 may include the under-display fingerprint sensor of the subject technology (e.g., 102 of FIG. 1A). The under-display optical fingerprint sensor of the subject technology can be readily integrated into the wireless communication device 800, in particular, when the wireless communication device 800 is a smartphone or a smartwatch.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter genders (e.g., her and its) and vice versa. Headings and subheadings, if any, are used for convenience only and do not limit the subject disclosure.

The predicate words "configured to," "operable to," and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An apparatus for fingerprint sensing, the apparatus comprising:
    a light-emitting layer covered by a transparent layer, comprising first light-emitting diodes in a first region and second light-emitting diodes in a second region, and being configured to illuminate a surface touching the transparent layer and to allow transmission of reflected light from the surface to underlying layers including:
        an optical layer including a plurality of optical elements;
        a filter layer including a plurality of apertures and configured to spatially process the reflected light; and
        a pixelated image sensor comprising a first imaging area beneath the first region of the light-emitting layer and a second imaging area beneath the second region of the light-emitting layer and being configured to sense the spatially processed reflected light,
    wherein at least one of the optical layer or the filter layer is configured to enable an angle-focused field-of-view (FOV) filtering of the reflected light to allow a reflected light arriving at an angle to pass through,
    wherein the second light-emitting diodes are configured to be turned off while the first light-emitting diodes are active and the second imaging area receives the reflected light.

2. The apparatus of claim 1, wherein the optical layer comprises a microlens layer including a plurality of microlenses, wherein the optical layer is configured to enable the angle-focused FOV filtering of the reflected light, and wherein the plurality of optical elements are configured to bend incident rays.

3. The apparatus of claim 2, wherein the filter layer is configured to enable the angle-focused FOV filtering of the reflected light, and wherein the apertures of the plurality of apertures are misaligned with respect to centers of respective microlenses of the plurality of microlenses.

4. The apparatus of claim 2, wherein the optical layer comprises a multilayer optical structure including multiple microlens layers, and wherein the light-emitting layer comprises an organic light emitting diode (OLED) display.

5. The apparatus of claim 1, wherein the pixelated image sensor comprises a thin-film transistor (TFT)-based organic imager.

6. The apparatus of claim 1, wherein the filter layer comprises a fiber optics plate including a collection of optical fiber films bundled with an opaque separator material and is configured to achieve a narrow FOV of approximately +/−3 degrees.

7. The apparatus of claim 1, wherein the surface touching the transparent layer comprises a surface of a human finger including ridges and valleys, and wherein the filter layer is configured to eliminate reflections resulting from angled illumination of walls of valleys.

8. The apparatus of claim 7, wherein the light-emitting layer comprises an OLED display and the first light-emitting diodes and the second light-emitting diodes form an array of OLEDs, wherein the second light-emitting diodes are turned off to enable imaging of a region of the human finger with different occlusion patterns to reduce OLED display occlusion effects.

9. The apparatus of claim 1, wherein the at least one of the optical layer or the filter layer is configured to enable an enhanced fingerprint spoof detection by using the angle-focused FOV filtering of the reflected light.

10. A communication device comprising:
    a processor; and
    an angle-focused fingerprint sensing apparatus comprising:
        a transparent layer;
        a light-emitting layer covered by the transparent layer and configured to illuminate a finger touching the transparent layer and to allow transmission of reflected light from the finger for sensing;

an optical-processing layer;

a collimation layer including a plurality of apertures and configured to spatially process the reflected light; and an image sensor configured to sense the spatially processed reflected light, wherein the optical-processing layer is configured to enable an angle-focused FOV filtering of the reflected light to allow a reflected light arriving at an angle to pass through, wherein the processor is configured to operate the light-emitting layer with a portion of the light-emitting layer being off, the portion of the light-emitting layer being positioned above a portion of the image sensor that receives the reflected light.

11. The communication device of claim 10, wherein the optical-processing layer comprises a diffractive layer including diffractive elements configured to diffract the reflected light to enable the angle-focused FOV filtering of the reflected light.

12. The communication device of claim 10, wherein the optical-processing layer comprises a microlens layer including a plurality of microlenses, and wherein the plurality of microlenses are configured to bend incident rays.

13. The communication device of claim 10, wherein the image sensor comprises a pixelated-image sensor comprising a TFT-based organic imager, and wherein the light-emitting layer comprises an OLED display.

14. The communication device of claim 13, wherein the portion of the light-emitting layer is turned off to enable imaging of a region of the finger with different occlusion patterns to reduce OLED display occlusion effects.

15. The communication device of claim 10, wherein the collimation layer comprises one of a micro-aperture plate or a fiber-optics plate, and wherein the collimator layer is configured to provide a narrow FOV within a range of about +/−0.5 to +/−10 degrees.

16. An angle-focused fingerprint-sensing apparatus, the apparatus comprising:

a touch-display layer comprising a first portion and a second portion and being configured to illuminate a touching surface and to transmit reflected light from the touching surface for sensing;

an optical layer;

a filter layer configured to process the reflected light; and a pixelated image sensor configured to sense the processed reflected light, wherein the filter layer is configured to enable an angle-focused FOV filtering of the reflected light to allow a reflected light arriving at an angle to pass through, wherein the second portion of the touch-display layer is configured to be off while the first portion of the touch-display layer is active, the second portion being positioned above a portion of the pixelated image sensor that receives the reflected light.

17. The apparatus of claim 16, wherein the optical layer comprises a plurality of optical elements, wherein the plurality of optical elements comprises a plurality of microlenses.

18. The apparatus of claim 17, wherein the filter layer comprises a plurality of apertures, and wherein apertures of the plurality of apertures are misaligned with respect to centers of respective microlenses of the plurality of microlenses.

19. An apparatus for fingerprint sensing, the apparatus comprising:

a transparent layer;

a touch-display layer comprising a first portion and a second portion and being coupled to the transparent layer and configured to emit light to illuminate a surface touching the transparent layer and to allow transmission of a reflected light from the surface;

an optical-processing layer;

a collimation layer including a plurality of apertures and configured to spatially process the reflected light; and an image sensor configured to sense the spatially processed the reflected light, wherein:

the touch-display layer allows transmission of reflected light from the surface to the optical-processing layer, and the optical-processing layer is configured to enable an angle-focused field-of-view (FOV) filtering of the reflected light to allow a reflected light arriving at an angle to pass through, wherein the second portion of the touch-display layer is configured to be off while the first portion of the touch-display layer is active, the second portion being positioned above a portion of the image sensor that receives the reflected light.

20. The apparatus of claim 19, wherein the optical-processing layer comprises a diffractive layer including diffractive elements configured to diffract the reflected light to enable the angle-focused FOV filtering of the reflected light.

21. The apparatus of claim 19, wherein the optical-processing layer comprises a microlens layer including a plurality of microlenses.

22. The apparatus of claim 21, further comprising a holographic layer disposed between the touch-display layer and the optical-processing layer.

23. The apparatus of claim 19, wherein the optical-processing layer comprises a multilayer structure including multiple layers of optical elements, wherein the optical elements include microlenses.

24. The apparatus of claim 19, wherein the touch-display layer comprises an organic light-emitting diode (OLED) display, and wherein the portion of the touch-display layer is turned off to enable imaging of a region of a human finger with different occlusion patterns to reduce OLED display occlusion effects.

25. The apparatus of claim 19, wherein the collimation layer comprises a microaperture plate including transparent glass or resin embedded in an opaque glass or resin material and is configured to provide a narrow FOV of approximately +/−3 degrees.

* * * * *